US012310213B2

United States Patent
Qiu

(10) Patent No.: US 12,310,213 B2
(45) Date of Patent: May 20, 2025

(54) PIXEL ARRANGEMENT STRUCTURE, DISPLAY PANEL, AND MASK ASSEMBLY

(71) Applicant: Xiamen Tianma Display Technology Co., Ltd., Xiamen (CN)

(72) Inventor: Shaoya Qiu, Wuhan (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 387 days.

(21) Appl. No.: 17/852,047

(22) Filed: Jun. 28, 2022

(65) Prior Publication Data

US 2023/0165099 A1 May 25, 2023

(30) Foreign Application Priority Data

Nov. 23, 2021 (CN) .......................... 202111391636.X

(51) Int. Cl.
| | | |
|---|---|---|
| H01L 27/32 | (2006.01) | |
| H01L 51/56 | (2006.01) | |
| H10K 59/35 | (2023.01) | |
| H10K 71/00 | (2023.01) | |

(52) U.S. Cl.
CPC ......... *H10K 59/353* (2023.02); *H10K 59/352* (2023.02); *H10K 71/00* (2023.02)

(58) Field of Classification Search
CPC .............................................. H10K 59/35–353
See application file for complete search history.

(56) References Cited

U.S. PATENT DOCUMENTS

| | | | | |
|---|---|---|---|---|
| 8,314,866 B2 * | 11/2012 | Massetti | ............. | H04N 25/134 |
| | | | | 348/280 |
| 2016/0126298 A1 * | 5/2016 | Chen | .................... | H10K 59/353 |
| | | | | 257/40 |
| 2016/0293678 A1 * | 10/2016 | Wang | ..................... | H10D 86/00 |
| 2020/0075691 A1 * | 3/2020 | Zhou | ..................... | H10K 59/35 |

FOREIGN PATENT DOCUMENTS

CN        106981501 B  *   7/2020  .......... H10K 71/166

OTHER PUBLICATIONS

Machine translation, Wang, Chinese Pat. Pub. No. CN106981501B, translation date: Feb. 6, 2025, Clarivate Analytics, all pages. (Year: 2025).*

* cited by examiner

*Primary Examiner* — Victoria K. Hall
(74) *Attorney, Agent, or Firm* — Anova Law Group, PLLC

(57) ABSTRACT

A pixel arrangement structure for a display panel includes a plurality of repetition components arranged in rows and columns. Each repetition component includes: a first pixel group including two or more first sub-pixels arranged in a column direction, two adjacent first sub-pixels at least partially overlapping with each other in the column direction; a second pixel group disposed on a side of the first pixel group in a row direction and including two or more second sub-pixels arranged in the column direction, two adjacent second sub-pixels at least partially overlapping with each other in the column direction; and a third pixel group including two or more third sub-pixels, the two or more third sub-pixels including at least one first-type third sub-pixel disposed between the first pixel group and the second pixel group, and at least one second-type third sub-pixel disposed on a side of the second pixel group.

15 Claims, 11 Drawing Sheets

PIXEL ARRANGEMENT STRUCTURE, DISPLAY PANEL, AND MASK ASSEMBLY

CROSS-REFERENCE TO RELATED APPLICATION

This application claims priority to Chinese Patent Application No. 202111391636.X, filed on Nov. 23, 2021, the entire content of which is incorporated herein by reference.

TECHNICAL FIELD

The present disclosure relates to the technical field of display technology and, more particularly, to a pixel arrangement structure, a display panel, and a mask assembly.

BACKGROUND

Organic light-emitting diode (OLED) is an active light-emitting device. Compared with the display mode of the traditional liquid crystal display (LCD), the OLED display technology does not need a backlight and has self-luminous characteristics. The OLED uses a thinner organic material film layer and a glass substrate. When a current passes through the OLED, the organic material emits light. Therefore, the OLED display panel can significantly save power, can be made lighter and thinner, can withstand a wider range of temperature changes than the LCD display panel, and has a larger viewing angle. The OLED display panel is expected to become the next-generation flat panel display technology since the LCD display panel, and it is one of the most popular flat panel display technologies.

A pixel arrangement structure in the OLED display panel plays an important role in display effect of the OLED display panel. Therefore, how to design a desired pixel arrangement structure has become an urgent technical problem to be solved.

SUMMARY

One aspect of the present disclosure provides a pixel arrangement structure for a display panel. The pixel arrangement structure includes a plurality of repetition components arranged in rows and columns. Each repetition component includes: a first pixel group including two or more first sub-pixels arranged in a column direction, two adjacent first sub-pixels at least partially overlapping with each other in the column direction; a second pixel group disposed on a side of the first pixel group in a row direction and including two or more second sub-pixels arranged in the column direction, two adjacent second sub-pixels at least partially overlapping with each other in the column direction; and a third pixel group including two or more third sub-pixels, the two or more third sub-pixels including at least one first-type third sub-pixel disposed between the first pixel group and the second pixel group and at least one second-type third sub-pixel disposed on a side of the second pixel group facing away from the first pixel group. A number ratio of first sub-pixels, second sub-pixels, and third sub-pixels is 1:1:1, and along the column direction, at least one first sub-pixel partially overlaps with the third sub-pixels, and at least one second sub-pixel partially overlaps with the third sub-pixels.

Another aspect of the present disclosure provides a display panel. The display panel includes a pixel arrangement structure. The pixel arrangement structure comprises a plurality of repetition components arranged in rows and columns. Each repetition component includes: a first pixel group including two or more first sub-pixels arranged in a column direction, two adjacent first sub-pixels at least partially overlapping with each other in the column direction; a second pixel group disposed on a side of the first pixel group in a row direction and including two or more second sub-pixels arranged in the column direction, two adjacent second sub-pixels at least partially overlapping with each other in the column direction; and a third pixel group including two or more third sub-pixels, the two or more third sub-pixels including at least one first-type third sub-pixel disposed between the first pixel group and the second pixel group and at least one second-type third sub-pixel disposed on a side of the second pixel group facing away from the first pixel group. A number ratio of first sub-pixels, second sub-pixels, and third sub-pixels is 1:1:1, and along the column direction, at least one first sub-pixel partially overlaps with the third sub-pixels, and at least one second sub-pixel partially overlaps with the third sub-pixels.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
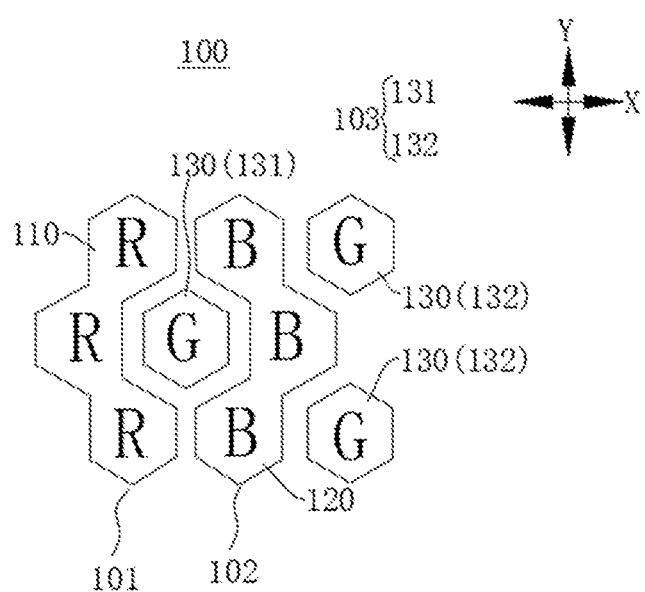
FIG. 1 illustrates a schematic structural diagram of a repetition component of an exemplary pixel arrangement structure according to some embodiments of the present disclosure.

Various features and embodiments of the present disclosure are described in detail below with reference to the accompanying drawings. In the description below, numerous specific details are proposed to provide a comprehensive understanding of the present disclosure. However, for those skilled in the art, the present disclosure may be implemented without some of the specific details. The description of the embodiments below is intended to provide a better understanding of the present disclosure through examples. In the drawings and the specification below, certain well-known structures and technical details are not shown to avoid unnecessary ambiguity. For clarity, dimensions of certain structures may be expanded to show structural details. In addition, the features, structures, or characteristics described below may be combined in one or more embodiments in any suitable manner.

In the description of the present disclosure, it should be noted that, unless otherwise specified, "plurality" means two or more. The orientation or position relationship indicated by terms "upper," "lower," "left," right," inner," and "outer" are only for the convenience and simplification of describing the present disclosure, do not indicate or imply that a device or an element referred herein must have a specific orientation or must be constructed and operated in a specific orientation, and hence cannot be construed as limiting the present disclosure. In addition, terms "first" and "second" are only used for illustration purpose, and cannot be construed as indicating or implying relative importance.

Words appeared in the description below for describing directions refer to directions in the drawings, and do not limit a specific structure of the embodiments of the present disclosure. In the description of the present disclosure, it should be noted that, unless otherwise clearly specified and limited, terms "installation" and "connection" should be interpreted in a broad sense. For example, the terms may refer to a fixed connection, a detachable connection, or an integral connection. The connection may be direct or indirect. For those of ordinary skill in the art, the specific meaning of the above-mentioned terms in the specification can be interpreted according to specific circumstances.

For better illustration of the embodiments of the present disclosure, pixel arrangement structures, display panels, and mask assemblies will be described in detail below with reference to FIGS. 1-11.

Figure 2:
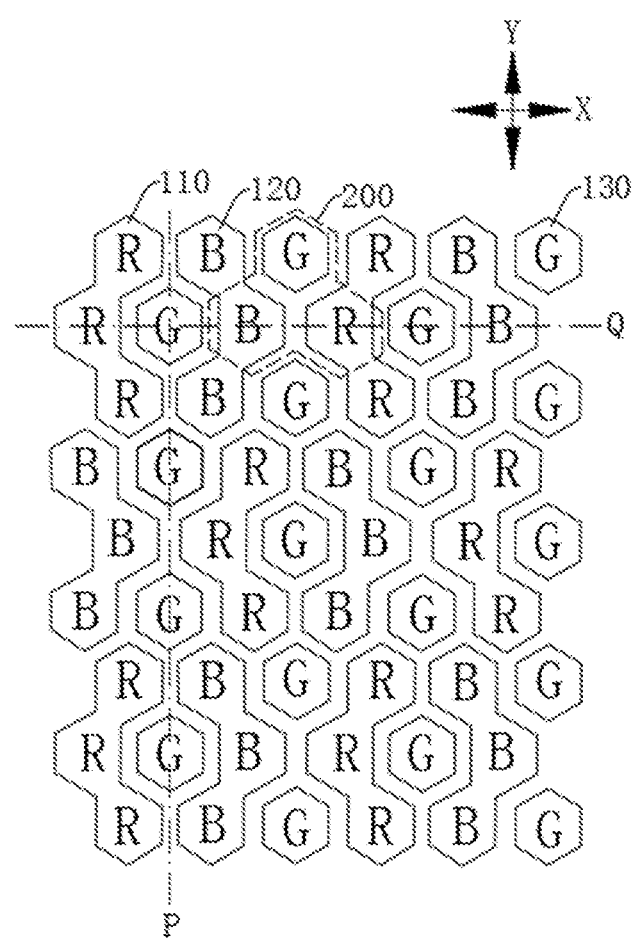
FIG. 2 illustrates a schematic structural diagram of an exemplary pixel arrangement structure according to some embodiments of the present disclosure.

FIG. 1 illustrates a schematic structural diagram of a repetition component of an exemplary pixel arrangement structure according to some embodiments of the present disclosure. FIG. 2 illustrates a schematic structural diagram of an exemplary pixel arrangement structure according to some embodiments of the present disclosure.

As shown in FIG. 1 and FIG. 2, the present disclosure provides a pixel arrangement structure for a display panel. The pixel arrangement structure includes a plurality of repetition components 100 arranged in rows and columns. The repetition component 100 includes a first pixel group 101, a second pixel group 102, and a third pixel group 103. The first pixel group 101 includes two or more first sub-pixels 110 arranged along a column direction Y, and adjacent two first sub-pixels 110 in the column direction Y are at least partially overlapped. Disposed on a side of the first pixel group 101 along a row direction X, the second pixel group 102 includes two or more second sub-pixels 120 arranged along the column direction Y, and adjacent two second sub-pixels 120 in the column direction Y are at least partially overlapped. The third pixel group 103 includes two or more third sub-pixels 130. The two or more third sub-pixels 130 includes at least one first-type third sub-pixel 131 and at least one second-type third sub-pixel 132. The at least first-type third sub-pixel 131 is disposed between the first pixel group 101 and the second pixel group 102. The at least one second-type third sub-pixel 132 is disposed on a side of the second pixel group 102 facing away from the first pixel group 101. A number ratio of first sub-pixels 110, second sub-pixels 120, and third sub-pixels 130 is 1:1:1. Along the column direction Y, at least one first sub-pixel 110 partially overlaps with the third sub-pixels 130, and at least one second sub-pixel 120 partially overlaps with the third sub-pixels 130.

As shown in FIG. 1 and FIG. 2, structures of the first pixel group 101 and the second pixel group 102 are defined by solid lines, which do not constitute a structural limitation on the pixel arrangement structure of the embodiments of the present disclosure. In some embodiments, the row direction is the X direction in FIG. 1, and the column direction is the Y direction in FIG. 1. In some other embodiments, the row direction may be the Y direction in FIG. 1, and the column direction may be the X direction in FIG. 1.

In the pixel arrangement structure provided by the embodiments of the present disclosure, the pixel arrangement structure includes the first pixel group 101, the second pixel group 102, and the third sub-pixels 130 arranged in the row direction X. The first pixel group 101 includes two or more first sub-pixels, and the adjacent two or more first sub-pixels 110 at least partially overlap in the column direction Y, such that the two or more first sub-pixels 110 can be vapor-deposited by a same mask opening of a mask. Similarly, the two or more second sub-pixels 120 at least partially overlap in the column direction Y, such that the two or more second sub-pixels 120 can be vapor-formed by the same mask opening of the mask. When the two or more sub-pixels in the pixel arrangement structure are vapor-deposited by the same mask opening, on one hand, the number of mask openings of the mask can be reduced to facilitate the preparation and molding of the mask, on the other hand, complexity of vapor-depositing the pixel arrangement structure can be reduced. Thus, the embodiments of the present disclosure can reduce not only the complexity of fabricating the pixel arrangement structure but also the complexity of making the mask for vapor-depositing the pixel arrangement structure.

In addition, the number ratio of the first sub-pixels 110, the second sub-pixels 120, and the third sub-pixels 130 is 1:1:1. That is, three sub-pixels that form a white light-emitting display component 200, enclosed by dashed lines as shown in FIG. 2, are physical sub-pixels. There is no need to share sub-pixels. As such, display effect of the pixel arrangement structure is improved. When the repetition component 100 is repeatedly arranged in sequence to form the pixel arrangement structure, the at least one first-type third sub-pixel 131 is disposed between the first pixel group 101 and the second pixel group 102, and the at least one second-type third sub-pixel 132 is disposed between the second pixel group 102 and the first pixel group 101 of another repetition component 100. At least one first sub-pixel 110 partially overlaps with the third sub-pixels 130. At least one second sub-pixel 120 partially overlaps with the third sub-pixels 130. As such, distances between the three sub-pixels that form the display unit 200 can be reduced, and the display effect of the pixel arrangement structure is further improved. As shown in FIG. 2, the dashed lines define a structure of the display component 200. The dashed lines do not constitute a structural limitation on the pixel arrangement structure provided by the embodiments of the present disclosure.

In some embodiments, a shape of the first-type third sub-pixel 131 is the same as a shape of the second-type third sub-pixel 132. However, the first-type third sub-pixel 131 and the second-type third sub-pixel 132 are deposed at different positions. In the repetition component 100, the first-type third sub-pixel 131 is disposed between the first pixel group 101 and the second pixel group 102, and the second-type third sub-pixel 132 is disposed outside the first pixel group 101 and the second pixel group 102. That is, in the entire pixel arrangement structure, the first sub-pixels 130 are disposed between any adjacent first pixel group 101 and the second pixel group 102 in the row direction X.

In some embodiments, the first pixel group 101 and the second pixel group 102 in the repetition component 100 are symmetrically arranged with respect to the first-type third sub-pixel 131. The first-type third sub-pixel 131 joins with the first sub-pixel 110 and the second sub-pixel 120 disposed on both sides of the first-type third sub-pixel 131 to form the display component 200. In some embodiments, the first pixel group 101 and the second pixel group 102 are symmetrically arranged with respect to the first-type third sub-pixel 131, such that in the formed display component 200, distances between the first-type third sub-pixel 131 and both of the first sub-pixel 120 and the second sub-pixel 120 are closer, thereby achieving a more uniform display effect.

In some embodiments, when the repetition components 100 are arranged in sequence along the row direction X, the second pixel group 102 of a preceding repetition component 100 and the first pixel group 101 of an adjacent repetition component 100 in the row direction X are symmetrically arranged with respect to the second-type third sub-pixel 132, thereby further improving the display effect.

In some embodiments, in the repetition component 100, at least a portion of the first pixel group 101 has an edge arranged in parallel with an edge of at least a portion of the first-type third sub-pixel 131 to reduce a distance between the first sub-pixel 110 and the third sub-pixel 130, thereby improving the display effect.

In some embodiments, in the repetition component 100, at least a portion of the second pixel group 102 has an edge arranged in parallel with the edge of the at least a portion of the first-type third sub-pixel 131 to reduce a distance between the third sub-pixel 130 and the second sub-pixel 120, thereby improving the display effect.

In some embodiments, in the same repetition component 100, at least a portion of the second pixel group 102 has the edge arranged in parallel with an edge of at least a portion of the second-type third sub-pixel 132 to reduce a distance between the second sub-pixel 120 and the third sub-pixel 130, thereby improving the display effect.

In some embodiments, in the same repetition component 100, at least a portion of the first pixel group 101 has the edge arranged in parallel with the edge of the at least a portion of the second-type third sub-pixel 132 to reduce a distance between the first sub-pixel 110 and the third sub-pixel 130, thereby improving the display effect.

Returning to FIG. 1 and FIG. 2, in some embodiments, the numbers of the first sub-pixels 110, the second sub-pixels 120, and the third sub-pixels 130 are all three. The number of the first-type third sub-pixel 131 is one. The number of the second-type third sub-pixels 132 is two. The two second-type third sub-pixels 132 are separately arranged in the column direction Y. The two second-type third sub-pixels 132 are disposed between the first sub-pixel 110 and the second sub-pixel 120 that are adjacent in the row direction X.

In some embodiments, the arrangement of the first sub-pixel 110, the second sub-pixel 120, and the third sub-pixel 130 is more uniform, and the distances between the three sub-pixels used to form the same display component can be reduced. Thus, the display effect of the pixel arrangement structure can be improved.

In some embodiments, multiple repetition components 100 are arranged in multiple rows and multiple columns. The repetition components 100 in two adjacent rows are arranged in a staggered manner. The first-type third sub-pixels 131 in the (i)th row of the repetition components 100 are aligned in the column direction Y with the corresponding second-type third sub-pixels 132 in the (i−1)th row of the repetition components 100. i is a positive integer greater than 1.

In some embodiments, when the first-type third sub-pixels 131 in the (i)th row of the repetition components 100 are aligned in the column direction Y with the second-type third sub-pixels 132 in the (i−1)th row of the repetition components 100, the first pixel group 101 disposed on a side of the first-type third sub-pixel 131 in the (i)th row of the repetition components 100 at least partially overlaps in the column direction Y with the second pixel group 102 disposed on the same side of the second-type third sub-pixel 132 in the (i−1)th row of the repetition components 100. That is, the first pixel groups 101 and the second pixel groups 102 are alternately arranged along the column direction Y, thereby avoiding obvious monochromatic display stripes in the pixel arrangement structure. Further, aligning the first-type third sub-pixels 131 in the (i)th row of the repetition components 100 in the column direction Y with the second-type third sub-pixels 132 in the (i−1)th row of the repetition components 100 makes the arrangement of the third sub-pixels 130 in the pixel arrangement structure more uniform.

In some embodiments, at least one first sub-pixel 110 in the (i)th row of the repetition components 100 aligns in the column direction Y with at least one second sub-pixel 120 in the (i−1)th row of the repetition components 100. Thus, the monochromatic display stripes may be suppressed and the display effect may be improved.

In some embodiments, the first-type third sub-pixel 131 aligns in the row direction X with the first sub-pixel 110 disposed in a middle part of the first pixel group 101 in the column direction Y and with the second sub-pixel 120 in a middle part of the second pixel group 102 in the column direction Y.

In some embodiments, the first-type third sub-pixel 131 is disposed close to the middle part of the first pixel group 101 and the second pixel group 102 in the column direction Y. When the other two second-type third sub-pixels 132 are disposed respectively in the row direction X between the first sub-pixels 110 in the preceding repetition component 100 and the second sub-pixels 120 in the adjacent repetition component 100, all the third sub-pixels 130 can be disposed in the row direction X between the first sub-pixels 110 and the second sub-pixels 120. Thus, the obvious monochromatic display stripes can be avoided in the row direction X, and the arrangement of various sub-pixels is more uniform in the row direction X.

In addition, in some embodiments, one of the two adjacent rows of the sub-pixels in the entire pixel arrangement structure is repetitively arranged according to an order of the first sub-pixel 110, the second sub-pixel 120, and the third sub-pixel 130, and another of the two adjacent rows of the sub-pixels in the entire pixel arrangement structure is repetitively arranged according to an order of the first sub-pixel 110, the third sub-pixel 130, and the second sub-pixel 120. In the two adjacent rows of the sub-pixels, the third sub-pixels 130 in one row are disposed between the first sub-pixels 110 and the second sub-pixels 120 in another row.

Thus, the obvious monochromatic display stripes in the pixel arrangement structure can be avoided, the distances among the three sub-pixels that form a same display component 200 can be reduced, and the display effect of the pixel arrangement structure can be improved.

There are many ways to configure a shape of the third sub-pixels 130. The third sub-pixel 130 may have a circle shape, a polygon shape, or the like.

In some embodiments, the third sub-pixel 130 has a hexagon shape. Each third sub-pixel 130 is surrounded by three first sub-pixels 110 and three second sub-pixels 120.

In some embodiments, the third sub-pixel 130 has the hexagon shape. Each third sub-pixel 130 is surrounded by six sub-pixels, such that each of the first sub-pixels 110 and the second sub-pixels 120 disposed around the third sub-pixel 130 is arranged to share with one of the sides of the third sub-pixel 130. Thus, the distances from the third sub-pixel 130 to the surrounding sub-pixels can be reduced, and the pixels in the pixel arrangement structure can be tightly arranged.

In some embodiments, the third sub-pixel 103 has the hexagon shape. The first pixel group 101 and the second pixel group 102 are symmetrically arranged with respect to a first symmetry axis P of the first-type third sub-pixel 131 extending along the column direction Y. The first symmetry axis P is a diagonal line of the first-type third sub-pixel 131. Thus, a difference between the distance from the first sub-pixel 110 to the first-type third sub-pixel 131 and the distance from the second sub-pixel 120 to the first-type third sub-pixel 131 can be reduced, and the display effect is more uniform.

In some embodiments, the first pixel group 101 and the second pixel group 102 in one repetition component 100 are symmetrically arranged with respect to a second symmetry axis Q extending along the row direction X. The second symmetry axis Q passes through the first-type third sub-pixel 131. In some embodiments, the second symmetry axis Q passes through a center of the first-type third sub-pixel 131 in the column direction Y. In some embodiments, the first sub-pixels 110, the second sub-pixels 120, and the third sub-pixels 130 are arranged more uniformly, thereby further improving the uniformity of the pixel arrangement structure.

In some embodiments, returning to FIG. 1 and FIG. 2, the first sub-pixel 110 has the hexagon shape, and any two adjacent first sub-pixels 110 in the first pixel group 101 share a common side. When the first sub-pixels 110 have the hexagon shape and are arranged around the hexagon-shaped third sub-pixel 130, the sides of the first sub-pixels 110 are arranged in parallel with the corresponding sides of the third sub-pixels 130 to reduce the distance between each first sub-pixel 110 and corresponding third sub-pixel 130. Thus, the pixels in the pixel arrangement structure are tightly arranged, and the display effect of the pixel arrangement structure is further improved.

In some embodiments, returning to FIG. 1 and FIG. 2, the second sub-pixel 120 has the hexagon shape, and any two adjacent second sub-pixels 120 in the first pixel group 101 share a common side. When the second sub-pixels 120 have the hexagon shape and are arranged around the hexagon-shaped third sub-pixel 130, the sides of the second sub-pixels 120 are arranged in parallel with the corresponding sides of the third sub-pixels 130 to reduce the distance between each second sub-pixel 120 and corresponding third sub-pixel 130. Thus, the pixels in the pixel arrangement structure are tightly arranged, and the display effect of the pixel arrangement structure is further improved.

Figure 3:
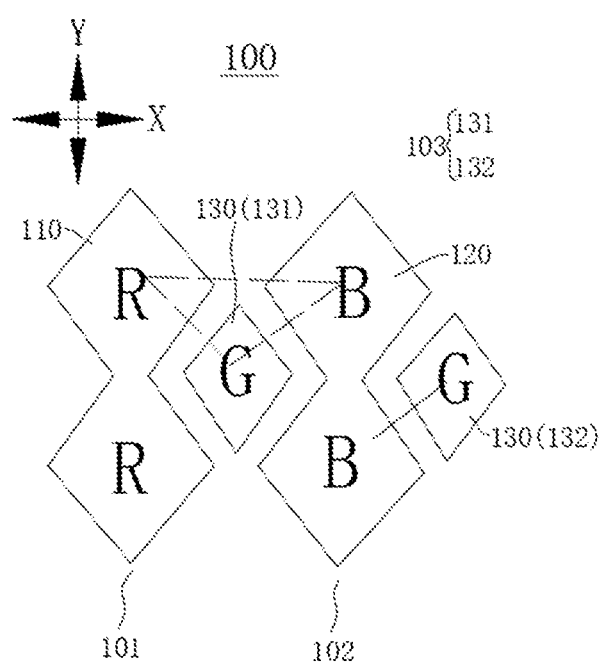
FIG. 3 illustrates a schematic structural diagram of another repetition component of an exemplary pixel arrangement structure according to some embodiments of the present disclosure.
Figure 4:
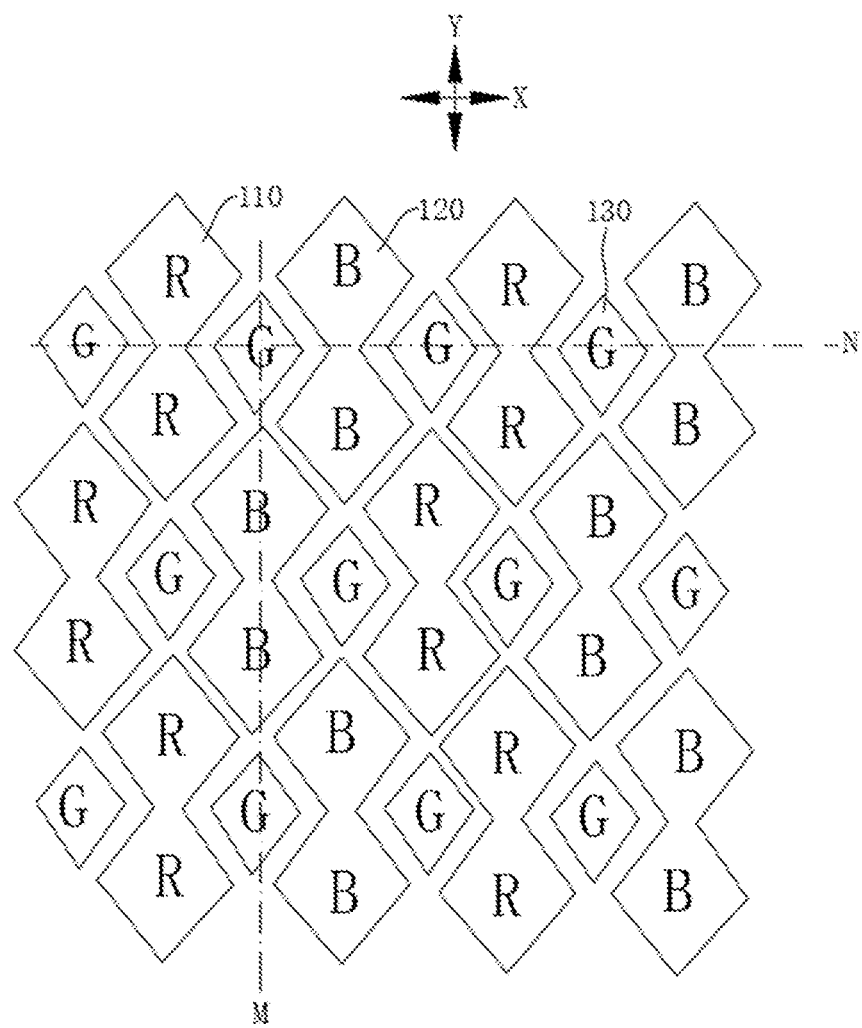
FIG. 4 illustrates a schematic structural diagram of another exemplary pixel arrangement structure according to some embodiments of the present disclosure.

FIG. 3 illustrates a schematic structural diagram of another repetition component 100 of an exemplary pixel arrangement structure according to some embodiments of the present disclosure. FIG. 4 illustrates a schematic structural diagram of another exemplary pixel arrangement structure according to some embodiments of the present disclosure.

As shown in FIG. 3 and FIG. 4, in some embodiments, the repetition component 100 includes two first sub-pixels 110, two second sub-pixels 120, and two third sub-pixels 130. The first-type third sub-pixel 131 and the second-type third sub-pixel 132 are arranged to align along the row direction X.

In some embodiments, the first pixel group 101 includes two first sub-pixels 110. The two first sub-pixels 110 can be formed by vapor deposition through a same mask opening. Similarly, the second pixel group 102 includes two second sub-pixels 120. The two second sub-pixels 120 can be formed by vapor deposition through a same mask opening. The third sub-pixels 130 are arranged to align along the row direction X, thereby simplifying arrangement structure of the third sub-pixels 130.

In some embodiments, returning to FIG. 4, multiple repetition components 100 are arranged in multiple rows and multiple columns. The repetition components 100 in any two adjacent rows are arranged in a staggered manner. The first pixel group 101 and/or the second pixel group 102 in the (i+1)th row of the repetition components 100 are disposed between the first pixel group 101 and the second pixel group 102 in the (i)th row of the repetition components 100.

In some embodiments, two adjacent rows of the repetition components 100 are arranged in a staggered manner. Thus, a distance between the two adjacent rows of the sub-pixels can be reduced, and the pixels in the pixel arrangement structure can be tightly arranged.

In some embodiments, the first pixel group 101 and the second pixel group 102 in the (i)th row at least partially overlap in the row direction X with the first pixel group 101 and the second pixel group 102 in the (i+1)th row. Thus, a distance between the first pixel group 101 and/or the second pixel group 102 in the (i)th row and the first pixel group 101 and/or the second pixel group 102 in the (i+1)th row can be reduced.

In some embodiments, returning to FIG. 4, the first-type third sub-pixel 131 in the (i+1)th row and the second pixel group 102 in the (i)th row are arranged to align along the column direction Y, the second-type third sub-pixel 132 in the (i+1)th row and the first pixel group 101 in the (i)th row are arranged to align along the column direction Y, or the first-type third sub-pixel 131 in the (i+1)th row and the first pixel group 101 in the (i)th row are arranged to align along the column direction Y, and the second-type third sub-pixel 132 in the (i+1)th row and the second pixel group 102 in the (i)th row are arranged to align along the column direction Y. Thus, the obvious monochromatic display stripes can be avoided in the column direction Y, and the display effect of the pixel arrangement structure can be improved.

In some embodiments, the third sub-pixel 130 has a rhombus shape. The first pixel group 101 and the second pixel group 102 are symmetrically arranged with respect to a third symmetry axis M of the third sub-pixel 130 extending in the column direction Y. The third symmetry axis M is a diagonal line of the third sub-pixel 130. Thus, a difference between a distance from the first sub-pixel 110 to the third sub-pixel 130 and a distance from the second sub-pixel 120 to the third sub-pixel 130 can be reduced, and the display effect is more uniform.

In some embodiments, returning to FIG. 4, the first pixel group 101 and the second pixel group 102 in the repetition component 100 are symmetrically arranged with respect to a fourth symmetry axis N extending in the row direction X. The fourth symmetry axis N passes through the third sub-pixel 130. In some embodiments, the fourth symmetry axis N passes through a center of the third sub-pixel 130 in the column direction Y. In some embodiments, the first sub-pixel 110, the second sub-pixel 120, and the third sub-pixel 130 are arranged more uniformly, thereby further improving display uniformity of the pixel arrangement structure.

In some embodiments, returning to FIG. 4, in two adjacent rows of the sub-pixels in the pixel arrangement structure, one of the two adjacent rows of the sub-pixels is repetitively arranged according to an order of the first sub-pixel 110, the first sub-pixel 110, and the third sub-pixel 130, and another of the two adjacent rows of the sub-pixels is repetitively arranged according to an order of the second sub-pixel 120, the second sub-pixel 120, and the third sub-pixel 130. In the two adjacent columns of the sub-pixels, the first sub-pixels 110 in one column are arranged to align in the row direction X with the second sub-pixel 120 in another column. The third sub-pixels 130 in one column and the third sub-pixels 130 in another column are arranged in a staggered manner. The third sub-pixels 130 corresponds to between two second sub-pixels 120 or two first sub-pixels 110 in a preceding column.

In some embodiments, returning to FIG. 3 and FIG. 4, the first sub-pixel 110 has a rhombus shape, and two adjacent first sub-pixels 110 in the first pixel group 101 share a common side. When the first sub-pixel 110 has the rhombus shape and the first sub-pixels 110 are arranged around the rhombus-shaped third sub-pixel 130, the sides of the first sub-pixels 110 are arranged in parallel with the corresponding sides of the third sub-pixel 130. Thus, the distance between each of the first sub-pixels 110 and the third sub-pixel 130 can be reduced, the pixels in the pixel arrangement structure can be tightly arranged, and the display effect of the pixel arrangement structure can be improved.

In some embodiments, returning to FIG. 3 and FIG. 4, the second sub-pixel 120 has a rhombus shape, and two adjacent second sub-pixels 120 in the second pixel group 102 share a common side. When the second sub-pixel 120 has the rhombus shape and the second sub-pixels 120 are arranged around the rhombus-shaped third sub-pixel 130, the sides of the second sub-pixels 120 are arranged in parallel with the corresponding sides of the third sub-pixel 130. Thus, the distance between each of the second sub-pixels 120 and the third sub-pixel 130 can be reduced, the pixels in the pixel arrangement structure can be tightly arranged, and the display effect of the pixel arrangement structure can be improved.

In some embodiments, referring to FIGS. 1-4, the first sub-pixel 110 is a red sub-pixel, the second sub-pixel 120 is a blue sub-pixel, and the third sub-pixel 130 is a green sub-pixel. In some embodiments, the third sub-pixel 130 is the green sub-pixel. Human eyes are sensitive to green color. When the third sub-pixel 130 is the green sub-pixel, the green sub-pixels are arranged more uniformly in the pixel arrangement structure, and no adjacent green sub-pixels exists. Thus, comfort of the human eyes can be improved, and the display effect can be improved.

Figure 5:
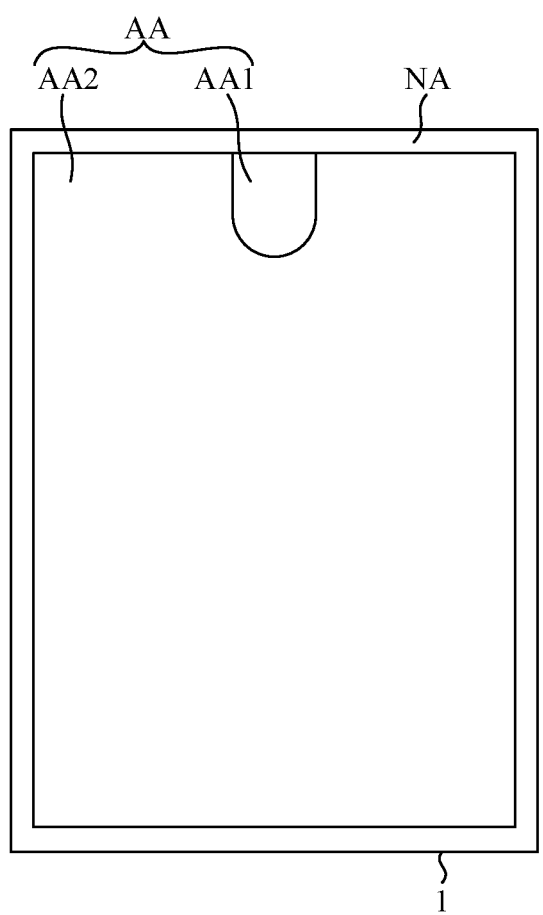
FIG. 5 illustrates a schematic structural diagram of an exemplary display panel according to some embodiments of the present disclosure.

FIG. 5 illustrates a schematic structural diagram of an exemplary display panel according to some embodiments of the present disclosure.

As shown in FIG. 5, the present disclosure also provides a display panel 1. The display panel 1 includes a display area AA. In some embodiments, the display panel 1 also includes a non-display area NA. The non-display area NA is arranged around the display area AA. In some embodiments, the display area AA further includes a first display area AA1 and a second display area AA2 surrounding at least a portion of the first display area AA1. The first display area AA1 may be used to configure a photosensitive component such as a camera or a sensor.

In some embodiments, the display panel 1 includes any of the pixel arrangement structures provided by the embodiments of the present disclosure. Because the display panel includes the pixel arrangement structure consistent with the embodiments of the present disclosure, the display panel has the beneficial effects of the pixel arrangement structure consistent with the embodiments of the present disclosure. The detailed description is omitted. In some embodiments, the pixel arrangement structure consistent with the embodiments of the present disclosure can be disposed in the first display area AA1 and/or the second display area AA2.

The present disclosure also provides a mask assembly for forming the pixel arrangement structure consistent with the embodiments of the present disclosure. The mask assembly includes a first mask 10, a second mask 20, and a third mask 30. The first mask 10 includes first mask openings 11 corresponding to the two or more first sub-pixels 110 in each repetition component 100 of the pixel arrangement structure. The second mask 20 includes second mask openings 21 corresponding to the two or more second sub-pixels 120 in each repetition component 100 of the pixel arrangement structure. The third mask 30 includes a first-type third mask and a second-type third mask. The first-type third mask includes first-type third mask openings 31 corresponding to the at least one first-type third sub-pixel 131 in each repetition component 100 of the pixel arrangement structure. The second-type third mask includes second-type third mask openings 32 corresponding to the at least one second-type third sub-pixel 132 in each repetition component 100 of the pixel arrangement structure. The mask assembly may be used to form any of the disclosed pixel arrangement structures.

In some embodiments, the first sub-pixel 110 and the second sub-pixel 120 are arranged in a same manner. The first pixel group 101 and the second pixel group 102 are bent in different directions. The first mask 10 and the second mask 20 may be multiplexed. The first mask 10 may be turned over to become the second mask 20. Or the second mask 20 may be turned over to become the first mask 10. Thus, quantity of masks can be reduced, and fabrication cost can be reduced.

Figure 6:
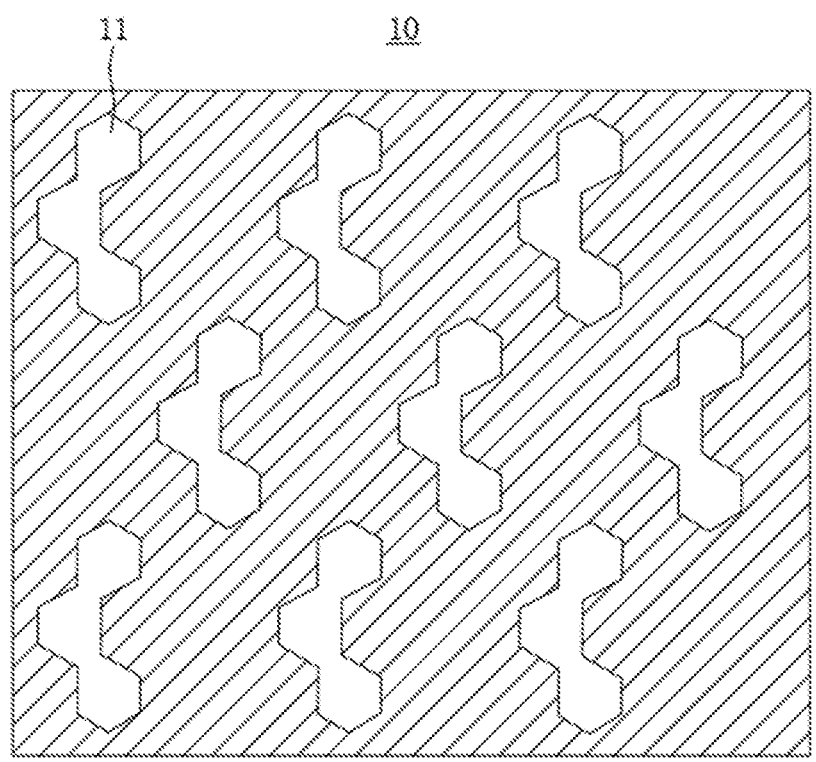
FIG. 6 illustrates a schematic structural diagram of a mask of an exemplary mask assembly according to some embodiments of the present disclosure.

FIG. 6 illustrates a schematic structural diagram of a mask 10 of an exemplary mask assembly according to some embodiments of the present disclosure. In some embodiments, when the first sub-pixels are arranged in the arrangement as shown in FIG. 1 and FIG. 2, the first mask 10 shown in FIG. 6 may be used to form the first sub-pixels 110 by vapor deposition.

Figure 9:
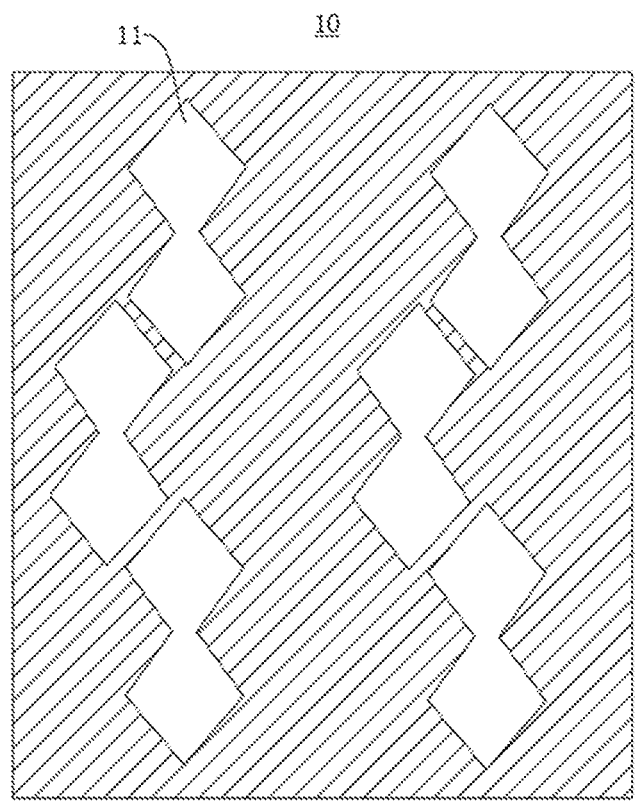
FIG. 9 illustrates a schematic structural diagram of a mask of another exemplary mask assembly according to some embodiments of the present disclosure.

FIG. 9 illustrates a schematic structural diagram of another mask 10 of an exemplary mask assembly according to some embodiments of the present disclosure. In some embodiments, when the first sub-pixels 110 are arranged in the arrangement as shown in FIG. 3 and FIG. 4, the first mask 10 shown in FIG. 9 may be used to form the first sub-pixels 110 by vapor deposition.

Figure 7:
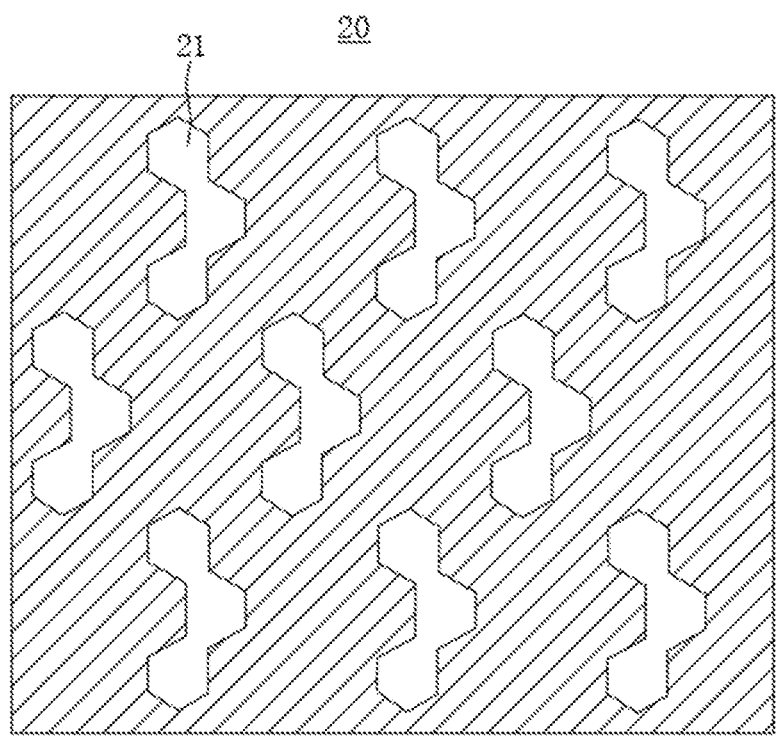
FIG. 7 illustrates a schematic structural diagram of another mask of an exemplary mask assembly according to some embodiments of the present disclosure.

FIG. 7 illustrates a schematic structural diagram of another mask 20 of an exemplary mask assembly according to some embodiments of the present disclosure. In some embodiments, when the second sub-pixels 120 are arranged in the arrangement as shown in FIG. 1 and FIG. 2, the second mask 20 shown in FIG. 7 may be used to form the second sub-pixels 120 by vapor deposition.

Figure 10:
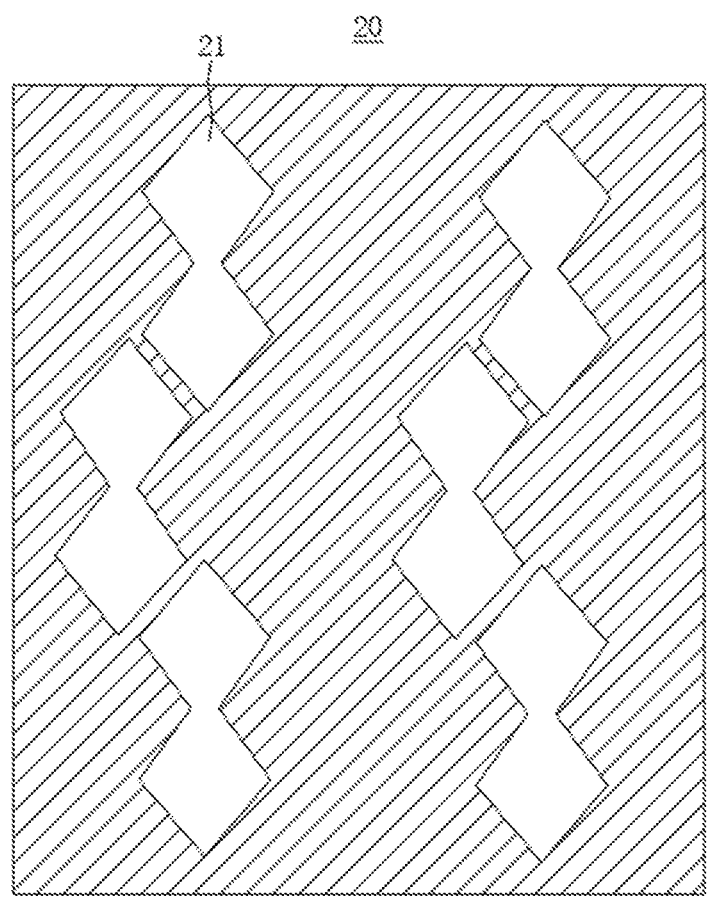
FIG. 10 illustrates a schematic structural diagram of another mask of another exemplary mask assembly according to some embodiments of the present disclosure.

FIG. 10 illustrates a schematic structural diagram of a mask 20 of another exemplary mask assembly according to some embodiments of the present disclosure. In some embodiments, when the second sub-pixels 120 are arranged in the arrangement as shown in FIG. 3 and FIG. 4, the second mask 20 shown in FIG. 10 may be used to form the second sub-pixels 120 by vapor deposition.

In some embodiments, in the pixel arrangement structures shown in FIG. 3 and FIG. 4, the first sub-pixels 110 and the second sub-pixels 120 are arranged in a same manner. Thus, the first mask 10 shown in FIG. 9 may be multiplexed to become the second mask 20 shown in FIG. 10, or the second mask 20 shown in FIG. 10 may be multiplexed to become the first mask 10 shown in FIG. 9.

Figure 8:
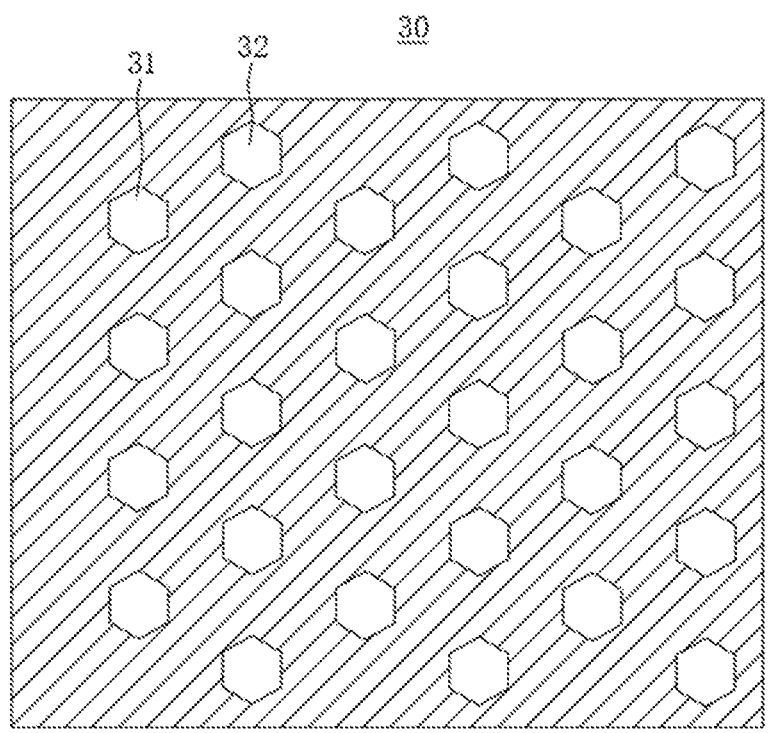
FIG. 8 illustrates a schematic structural diagram of another mask of an exemplary mask assembly according to some embodiments of the present disclosure.

FIG. 8 illustrates a schematic structural diagram of another mask 30 of an exemplary mask assembly according to some embodiments of the present disclosure. In some embodiments, when the third sub-pixels are arranged in the arrangement as shown in FIG. 1 and FIG. 2, the third mask 30 shown in FIG. 8 may be used to form the third sub-pixels 130 by vapor deposition.

Figure 11:
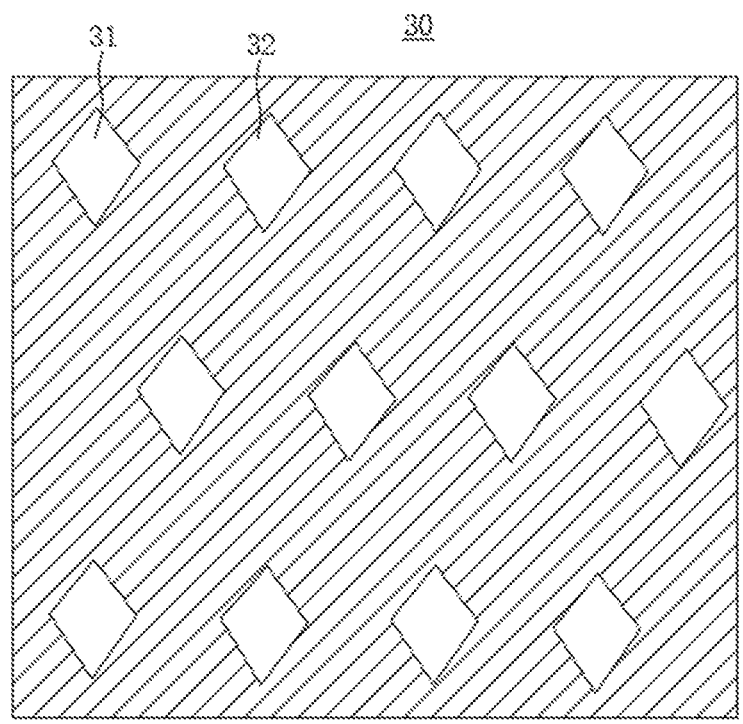
FIG. 11 illustrates a schematic structural diagram of another mask of another exemplary mask assembly according to some embodiments of the present disclosure.

FIG. 11 illustrates a schematic structural diagram of another mask 30 of another exemplary mask assembly according to some embodiments of the present disclosure. In some embodiments, when the third sub-pixels 130 are arranged in the arrangement as shown in FIG. 3 and FIG. 4, the third mask 30 shown in FIG. 11 may be used to form the third sub-pixels 130 by vapor deposition.

In the embodiments of the present disclosure, the pixel arrangement structure includes the plurality of repetition components arranged in rows and columns. Each repetition component includes the first pixel group, the second pixel group, and the third pixel group arranged in the row direction. The first pixel group includes the two or more first sub-pixels arranged in the column direction, and two adjacent first sub-pixels at least partially overlap with each other in the column direction, such that the two or more first sub-pixels can be formed by evaporation from openings on a same mask. Similarly, the second pixel group includes the two or more second sub-pixels arranged in the column direction, and two adjacent second sub-pixels at least partially overlap with each other in the column direction, such that the two or more second sub-pixels can be formed by evaporation from openings on another same mask. Thus, the embodiments of the present disclosure can reduce the difficulty of forming the pixel arrangement structure and the difficulty of making masks used for forming the pixel arrangement structure by evaporation.

In addition, the number ratio of first sub-pixels, second sub-pixels, and third sub-pixels is 1:1:1, that is, the three sub-pixels used to form a display unit that emits white light are all true sub-pixels, and no sub-pixel sharing occurs, thereby improving display effect of the pixel arrangement structure. When the plurality of repetition components is sequentially and repeatedly arranged to form the pixel arrangement structure, the at least one first-type third sub-pixel in the third pixel group is disposed between the first pixel group and the second pixel group, and the at least one second-type third sub-pixel in the third pixel group is disposed between the second pixel group and the first pixel group in an adjacent repetition component facing away from the first pixel group. Along the column direction, at least one first sub-pixel partially overlaps with the third sub-pixels, and at least one second sub-pixel partially overlaps with the third sub-pixels, thereby reducing distances between three sub-pixels that form a display unit, and further improving the display effect of the pixel arrangement structure.

In the specification, specific examples are used to explain the principles and implementations of the present disclosure. The description of the embodiments is intended to assist comprehension of the methods and core inventive ideas of the present disclosure. At the same time, those of ordinary skill in the art may change or modify the specific implementation and the scope of the application according to the embodiments of the present disclosure. Thus, the content of the specification should not be construed as limiting the present disclosure.

What is claimed is:

1. A pixel arrangement structure for a display panel, comprising:
   a plurality of repetition components arranged in rows and columns, each repetition component including:
      a first pixel group including two or more first sub-pixels arranged in a column direction, two adjacent first sub-pixels at least partially overlapping with each other in the column direction;
      a second pixel group disposed on a side of the first pixel group in a row direction and including two or more second sub-pixels arranged in the column direction, two adjacent second sub-pixels at least partially overlapping with each other in the column direction; and
      a third pixel group including two or more third sub-pixels, the two or more third sub-pixels including at least one first-type third sub-pixel disposed between the first pixel group and the second pixel group in the row direction and at least one second-type third sub-pixel disposed on a side of the second pixel group facing away from the first pixel group in the row direction,
   wherein a number ratio of first sub-pixels, second sub-pixels, and third sub-pixels is 1:1:1, and along the column direction, at least one first sub-pixel partially overlaps with the third sub-pixels, and at least one second sub-pixel partially overlaps with the third sub-pixels, and
   wherein:
      each repetition component includes three first sub-pixels, three second sub-pixels, and three third sub-pixels; and
      the three third sub-pixels include one first-type third sub-pixel and two second-type third sub-pixels, wherein the two second-type third sub-pixels are separately arranged in the column direction, and the two second-type third sub-pixels are disposed in the row direction between the second pixel group and another first pixel group adjacent to the second pixel group in the row direction.

2. The pixel arrangement structure according to claim 1, wherein:
   the first pixel group and the second pixel group in each repetition component are symmetrically arranged with respect to the first-type third sub-pixel.

3. The pixel arrangement structure according to claim 1, wherein in each repetition component:
   at least a portion of the first pixel group has an edge arranged in parallel with an edge of at least a portion of the first-type third sub-pixel; and/or
   at least a portion of the second pixel group has an edge arranged in parallel with an edge of at least a portion of the first-type third sub-pixel.

4. The pixel arrangement structure according to claim 1, wherein in each repetition component:
at least a portion of the second pixel group has an edge arranged in parallel with an edge of at least a portion of the second-type third sub-pixel; and/or
at least a portion of the first pixel group has an edge arranged in parallel with an edge of at least a portion of the second-type third sub-pixel.

5. The pixel arrangement structure according to claim 1, wherein:
repetition components in two adjacent rows are arranged in a staggered manner; and
first-type third sub-pixels in an (i)th row of the plurality of repetition components are aligned in the column direction with corresponding second-type third sub-pixels in an (i−1)th row of the plurality of repetition components, wherein i is a positive integer greater than 1.

6. The pixel arrangement structure according to claim 5, wherein:
at least one first sub-pixel in the (i)th row of the plurality of repetition components aligns in the column direction with at least one second sub-pixel in the (i−1)th row of the plurality of repetition components.

7. The pixel arrangement structure according to claim 1, wherein:
the first-type third sub-pixel aligns in the row direction with the first sub-pixel disposed in a middle part of the first pixel group in the column direction and with the second sub-pixel in a middle part of the second pixel group in the column direction.

8. The pixel arrangement structure according to claim 1, wherein:
the third sub-pixel has a hexagon shape; and
each third sub-pixel is surrounded by three first sub-pixels and three second sub-pixels.

9. The pixel arrangement structure according to claim 8, wherein:
the first pixel group and the second pixel group are symmetrically arranged with respect to a first symmetry axis of the first-type third sub-pixel extending along the column direction; and
the first symmetry axis is a diagonal line of the first-type third sub-pixel.

10. The pixel arrangement structure according to claim 1, wherein:
the first sub-pixels are red sub-pixels;
the second sub-pixels are blue sub-pixels; and
the third sub-pixels are green sub-pixels.

11. A mask assembly for forming the pixel arrangement structure according to claim 1, comprising:
a first mask including first mask openings corresponding to the two or more first sub-pixels in each repetition component of the pixel arrangement structure;
a second mask including second mask openings corresponding to the two or more second sub-pixels in each repetition component of the pixel arrangement structure; and
a third mask including a first-type third mask and a second-type third mask, wherein the first-type third mask includes first-type third mask openings corresponding to the at least one first-type third sub-pixel in each repetition component of the pixel arrangement structure and the second-type third mask includes second-type third mask openings corresponding to the at least one second-type third sub-pixel in each repetition component of the pixel arrangement structure.

12. The mask assembly according to claim 11, wherein:
the first mask is capable of being turned over to become the second mask; or
the second mask is capable of being turned over to become the first mask.

13. A display panel, comprising a pixel arrangement structure, wherein the pixel arrangement structure includes:
a plurality of repetition components arranged in rows and columns, each repetition component including:
a first pixel group including two or more first sub-pixels arranged in a column direction, two adjacent first sub-pixels at least partially overlapping with each other in the column direction;
a second pixel group disposed on a side of the first pixel group in a row direction and including two or more second sub-pixels arranged in the column direction, two adjacent second sub-pixels at least partially overlapping with each other in the column direction; and
a third pixel group including two or more third sub-pixels, the two or more third sub-pixels including at least one first-type third sub-pixel disposed between the first pixel group and the second pixel group in the row direction and at least one second-type third sub-pixel disposed on a side of the second pixel group facing away from the first pixel group in the row direction,
wherein a number ratio of first sub-pixels, second sub-pixels, and third sub-pixels is 1:1:1, and along the column direction, at least one first sub-pixel partially overlaps with the third sub-pixels, and at least one second sub-pixel partially overlaps with the third sub-pixels, and
wherein:
each repetition component includes three first sub-pixels, three second sub-pixels, and three third sub-pixels; and
the three third sub-pixels include one first-type third sub-pixel and two second-type third sub-pixels,
wherein the two second-type third sub-pixels are separately arranged in the column direction, and the two second-type third sub-pixels are disposed in the row direction between the second pixel group and another first pixel group adjacent to the second pixel group in the row direction.

14. The display panel according to claim 13, wherein:
the first pixel group and the second pixel group in each repetition component are symmetrically arranged with respect to the first-type third sub-pixel.

15. The display panel according to claim 13, wherein in each repetition component:
at least a portion of the first pixel group has an edge arranged in parallel with an edge of at least a portion of the first-type third sub-pixel; and/or
at least a portion of the second pixel group has an edge arranged in parallel with an edge of at least a portion of the first-type third sub-pixel.

* * * * *